United States Patent [19]
Kang et al.

[11] Patent Number: 6,091,093
[45] Date of Patent: Jul. 18, 2000

[54] PHOTODIODE HAVING TRANSPARENT INSULATING FILM AROUND GATE ISLANDS ABOVE P-N JUNCTION

[75] Inventors: Jung S Kang; James E Breisch, both of Chandler, Ariz.

[73] Assignee: Intel Corporation, Santa Clara, Calif.

[21] Appl. No.: 09/323,748

[22] Filed: Jun. 1, 1999

[51] Int. Cl.[7] .................. H01L 31/062; H01L 31/113
[52] U.S. Cl. .................. 257/292; 257/233; 257/234; 257/432
[58] Field of Search .................. 257/291, 292, 257/225, 232, 233, 234, 432

[56] References Cited

U.S. PATENT DOCUMENTS

| | | |
|---|---|---|
| 4,677,453 | 6/1987 | Matsumoto et al. . |
| 4,901,129 | 2/1990 | Hynecek . |
| 5,479,049 | 12/1995 | Aoki et al. .................. 257/642 |
| 5,705,837 | 1/1998 | Tanigawa et al. .................. 257/223 |
| 5,920,092 | 7/1999 | Watanabe .................. 257/292 |

*Primary Examiner*—Ngân V. Ngô
*Attorney, Agent, or Firm*—Blakely, Sokoloff, Taylor & Zafman LLP

[57] ABSTRACT

An embodiment of the invention is directed to a semiconductor photodiode made of a number of gate islands being spaced from each other and electrically insulated from each other by spacers. The spacers are formed above a p-n junction of the photodiode. The incident light is detected after it passes through the spacers and into a photosensitive region of the photodiode. The photodiode can be built using conventional metal oxide semiconductor (MOS) processes of the polysilicon-silicided gate or self-aligned types that use a lower doped drain (LDD) structure, without requiring an additional mask step that prevents the formation of the opaque silicide above the photosensitive semiconductor regions.

10 Claims, 7 Drawing Sheets

6,091,093

PHOTODIODE HAVING TRANSPARENT INSULATING FILM AROUND GATE ISLANDS ABOVE P-N JUNCTION

FIELD OF THE INVENTION

This invention is generally related to photodetectors made of semiconductor materials, and more particularly to photodiode structures suitable for manufacture with advanced logic integrated circuit fabrication techniques such as polycide-gate and salicide-gate MOS processes.

BACKGROUND

A key component of electronic imaging systems such as digital cameras and video cameras is the image sensor electronics. The image sensor electronics includes a sensor array and associated analog and digital processing circuitry. The sensor array captures the light image in electronic form using thousands of photocells. Each photocell provides an electrical signal proportional to the incident light at a portion of the image. These electrical signals are then processed into digital image data by the processing circuitry.

Recent developments in image sensor technology have attempted to reduce the cost of manufacturing the image sensor electronics by integrating the processing circuitry and the sensor array into the same integrated circuit (IC) die. Certain technologies that enable such integration include advanced logic IC fabrication processes such as polycide-gate metal oxide semiconductor (MOS) and salicide-gate MOS. These processes have traditionally been used to manufacture ICs such as microprocessors that have only logic functionality. Attempts have been made to adapt such processes to implement analog functionality and photodetection to develop a high performance, low cost image sensor IC die. See e.g. U.S. Patent Application of Mark Beiley et al., Ser. No. 08/873,987, filed Jun. 12, 1997, entitled A Well-To-Substrate Photodiode For Use In A CMOS Sensor On A Salicide Process ("Beiley"), currently pending; U.S. Pat. No. 5,841,126, issued Nov. 24, 1998 to Fossum, entitled CMOS Active Pixel Sensor Type Imaging System On A Chip. As discussed in Beiley, some of the problems with adapting the conventional logic process for photodetection have been difficulties in designing photocells that respond to incident light efficiently, i.e. have good quantum efficiency, have low leakage noise, and, of course, are relatively inexpensive to manufacture. Because the photocells are part of sensor ICs that are expected to be produced in very large quantities, it is important that the sensor IC be capable of manufacture without significant modifications to the flow of the logic process.

The logic process is conventionally optimized to implement a large number of tiny, densely packed transistors interconnected by multiple layers of metal to support complex logic functions. In conventional polycide-gate or salicide-gate MOS processes, a silicide formation step is performed after the semiconductor regions (usually silicon) corresponding to source, drain, and gate of the transistors in the IC have been formed. Silicide formation calls for depositing a blanket layer of refractory metal, normally everywhere on the surface of the wafer containing the sensor IC die, and then causing a reaction between the deposited refractory metal and any underlying silicon that constitutes the source, drain, and gate regions. One characteristic of such a logic process which is important for photocell design is that the resulting silicide is opaque, and thus prevents incident light from entering the photosensitive regions of the silicon below the surface. The silicided process can be customized for photocell construction by providing an additional mask step that prevents the formation of the silicide over those silicon regions that are used for photocells. However, such an additional mask step substantially increases the cost of manufacturing the IC.

SUMMARY

An embodiment of the invention is directed to a photodiode having a number of gate islands being spaced from each other and insulated from each other by spacers. The spacers are formed above a p-n junction of the photodiode. Incident light can pass through the spacers and into a photosensitive region of the photodiode.

Other features and advantages of the invention will be apparent from the accompanying drawings and from the detailed description that follows below.

BRIEF DESCRIPTION OF THE DRAWINGS

The invention is illustrated by way of example and not by way of limitation in the figures of the accompanying drawings in which like references indicate similar elements and in which.

DETAILED DESCRIPTION

An embodiment of the invention is directed to a photodiode and associated method of construction, using a conventional MOS process optimized for manufacturing logic circuitry, that avoids the additional mask step typically used to prevent the formation of suicide above the photosensitive regions of the semiconductor that constitutes the photodiodes. The invented photodiodes also exhibit good quantum efficiency and low leakage noise, thereby allowing the manufacture of a competitive image sensor IC.

Figure 1:
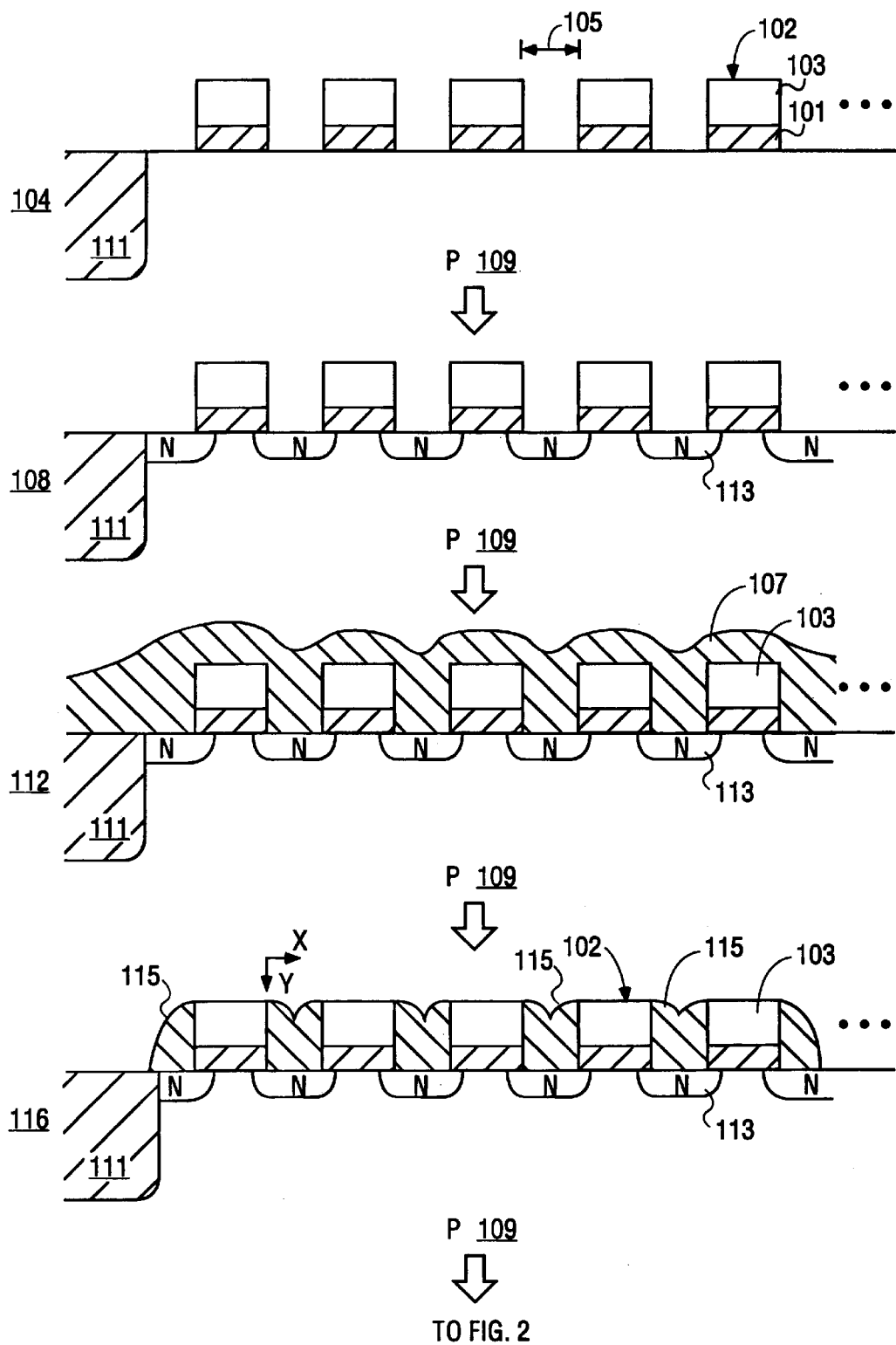
FIG. 1 shows a cross-section of a semiconductor structure at a number of steps of a process according to an embodiment of the invention.
Figure 2:
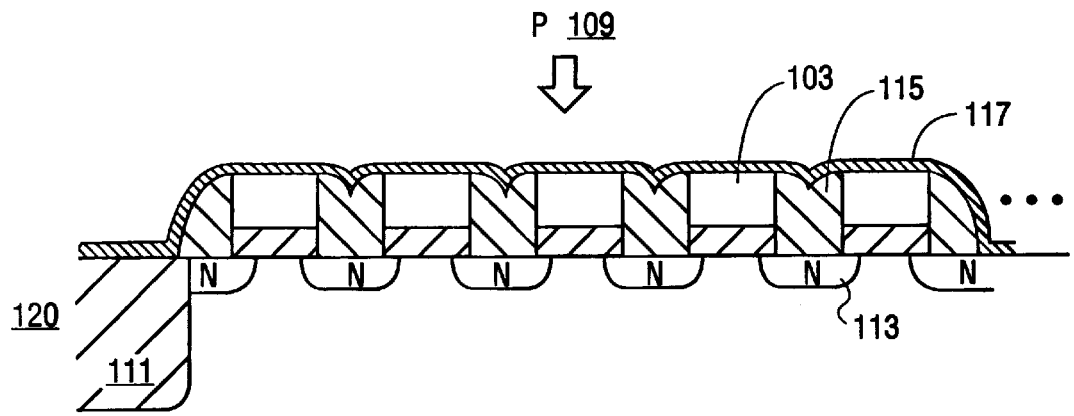
FIG. 2 shows the cross-section the semiconductor structure at further steps.
Figure 2:
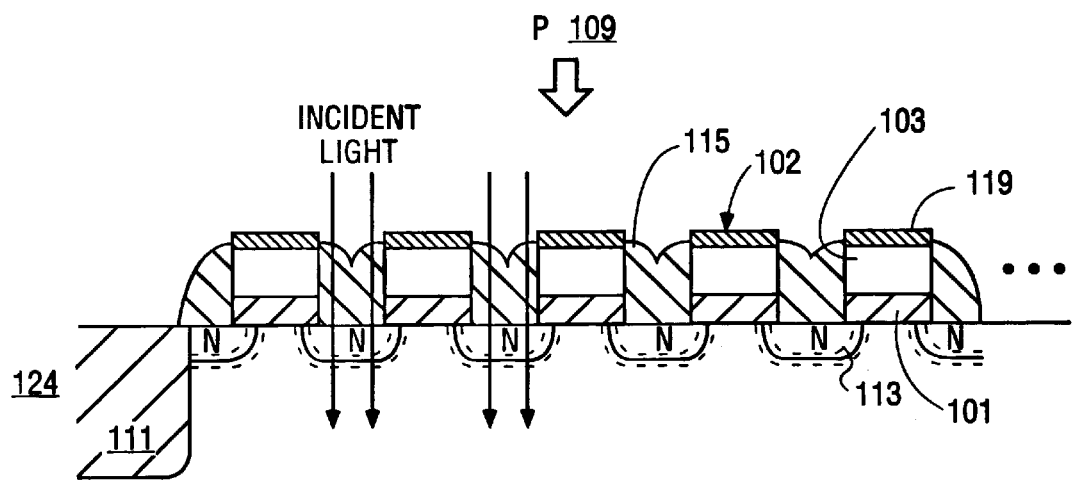

FIG. 1 and FIG. 2 illustrate cross-sectional views of a photodiode semiconductor structure as it is being built according to an embodiment of the invention. The actual photodiode has a three dimensional structure and will normally be part of a photocell, such as the one shown in FIG. 4. The structure is obtained by following a series of conventional MOS process steps on a semiconductor wafer. These steps are modified to obtain the particular photodiode structure shown, but without adding any mask steps. Operation begins with the formation of a number of gate islands 102. This involves the formation of a first semiconductor layer 103 above a first region 109 of semiconductor material. In the interim structure 104 shown in FIG. 1, the first semiconductor layer 103 includes a polysilicon layer that is deposited over a relatively thin insulation layer 101 of gate oxide grown on the surface of the first region 109. The region 109 in this embodiment is a substrate of the P conductivity type, although the photodiode can alternatively be built with the first region 109 being doped N-type. The particular p-n structure described here is only an example. An isolation region 111, depicted here by a shallow trench isolation (STI), is also formed to laterally isolate the photodiode from adjacent photodiodes (not shown in FIG. 1). Alternatives to the STI include, for example, a local oxidation of silicon (LOCOS) structure.

Figure 3:
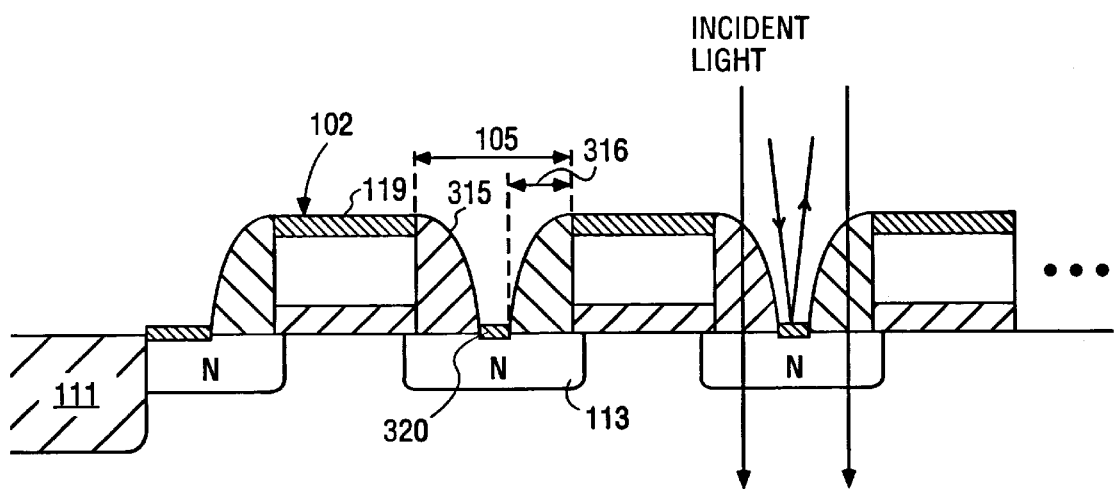
FIG. 3 illustrates the semiconductor structure obtained when the gate islands are spaced wider than twice the spacer width.

Following the formation of the first semiconductor layer 103, the layer is patterned as part of a gate formation step in a MOS logic fabrication process that is used to form the gates of field effect transistors (FETs) in the wafer, as shown in condition 104 of FIG. 1. The conventional pattern step is modified to yield a small number of gate islands 102, as shown in FIG. 3, each of which will be completely surrounded by an insulating material. The distance between the resulting adjacent gate islands 102, referring to gate spacing 105, of a photodiode may be adjusted to be either less than, the same as, or greater than twice the width of a typical transistor gate spacer that will be formed around each gate of a FET in the wafer. These options will be discussed below in connection with the forming of a spacer 115 as shown in the interim condition 116.

Following the formation of the gate islands 102 in the photodiode regions of the wafer, a second region 113 of semiconductor material is formed in the first region 109 as part of a FET drain/source formation step in the MOS process, as shown in condition 108. The second region 113 has a conductivity type that is normally opposite that of the first region 109, so that a p-n junction of the photodiode is formed between the first and second regions. The second region 113 extends slightly into the boundary defined by the gate island 102 by lateral diffusion. The second region 113 may be formed by doping the first region 109.

After forming the second region 113, the method continues with placing an insulating layer 107 over the first semiconductor layer 103, as shown in condition 112. When using certain MOS processes, this insulating layer 107 is of a dielectric material such as silicon nitride that is deposited everywhere on the wafer, without requiring a mask step. Alternative materials for the insulating layer 107 include silicon dioxide.

After forming the insulating layer 107, the method continues with removing portions of the layer 107 to expose a top surface of the semiconductor layer 103, as shown in the condition 116. This may be done by anisotropically etching the layer 107 to yield a spacer 115 on each side of the gate island 102. This etching is primarily in the y-direction rather than the x-direction, and is the same across the entire wafer.

Figure 8:
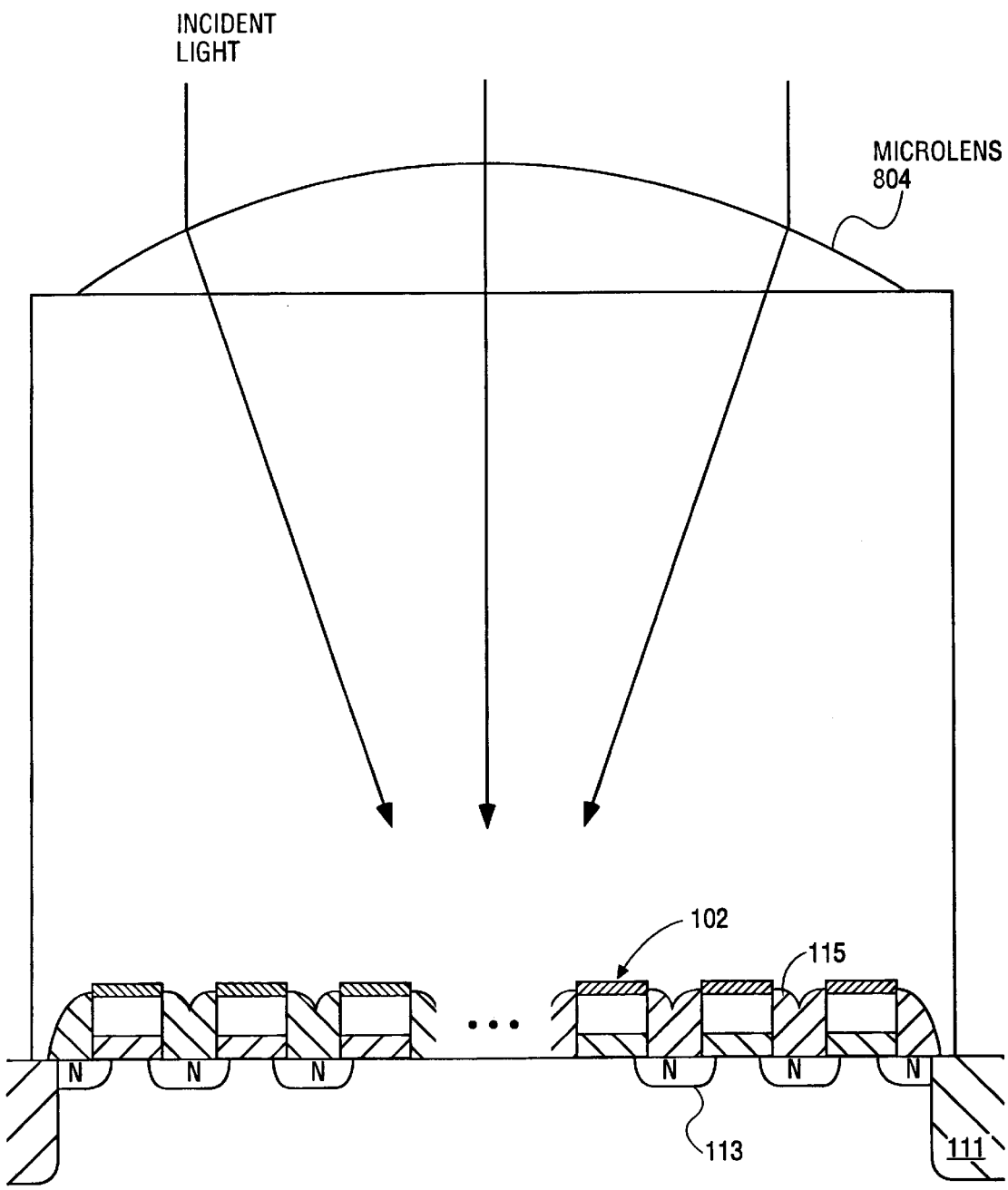
FIG. 8 illustrates a photodiode with a microlens formed above to focus the incident light.

Following the removal of certain portions of the insulating layer 107, a conducting layer 117 is placed over the first semiconductor layer 103 and the partially removed insulating layer 107 which was formed into spacers 115. This is shown in the interim condition 120, in FIG. 2. Thereafter, a portion of the conducting layer 117 is removed to expose the insulating layer 107, and in particular the spacers 115, as shown in the interim condition 124 (FIG. 2). When using certain MOS processes, the conducting layer 117 includes a refractory metal that is deposited everywhere on the wafer, without requiring a mask step. Examples of refractory metals that may be used include titanium, tantalum and molybedenum. When using a polycide or salicide gate process, the removal of portions of the conducting layer 117 includes the formation of a silicide 119 on the top surface of the semiconductor (here, polysilicon) layer 103, but not on the surface of the spacers 115 because there is no reaction between refractory metal and the dielectric material of the spacers 115. This allows incident light to pass through the insulating layer 107 (spacers 115) and reach a photosensitive region of the photodiode in the first and second semiconductor regions 109 and 113. The photosensitive region can loosely be defined as the region at and near the p-n junction, in the semiconductor of both the first region 109 and the second region 113 where electron-hole pairs are generated in response to the incident light. To improve the quantum efficiency of the photodiode structure, a microlens 804 may be formed above each photodiode as shown in FIG. 8.

In operation, the photodiode structure described above is initially reset by strongly reverse biasing the p-n junction defined between the second region 113 and the first region 109 to create a large depletion region, as shown by the dotted lines in the condition 124 of FIG. 2. The incident light passes through the spacers 115 and into a photosensitive region of the semiconductor material in the region 109. When the strong reverse bias is removed, the voltage across the photodiode decays in proportion to the intensity of the incident light, yielding a measure of the incident light intensity.

In an embodiment of the invention that uses a MOS process to build the photodiode structure, the insulating layer 101 is a relatively thin gate oxide layer. This is followed with the first semiconductor layer 103 that includes a polysilicon layer deposited on the gate oxide layer. This combination is part of the well known process of forming transistor gate structures that are of the polysilicon-silicide (polycide) variety in a self-aligned MOS process, also known as a salicide gate process. In this embodiment, the step of removing a portion of the conducting layer 117 includes causing the layer of refractory metal to react with the exposed silicon (second region 113) and polysilicon (layer 103) in the entire wafer to form a silicide 119. Note that the spacers 115 block the formation of the silicide over the second region 113, as well as blocking the formation of a highly doped source/drain of a MOSFET in the second region 113.

In certain MOS fabrication processes, the second region 113 includes an N-tip implant that surrounds each of the gate islands 102. The tip implant is a relatively shallow semiconductor region obtained by doping (e.g. by ion implantation) of a p-type region 109. The N-tip extends slightly into the region under the gate of a short channel MOSFET having a lightly doped drain (LDD) structure.

In certain embodiments of the invention, such as that shown in the interim condition 116, the portion of the first region 109 in which the second region 113 is formed, in between the gate islands 102, is entirely covered by the spacers 115. Here, the spacers 115 cover the entire silicon region between the gate islands 102, because, referring now to FIG. 3., the gate island spacing 105 (in the photodiode regions only) is less than twice the width of a transistor gate spacer 315. The transistor gate spacer 315 is formed on either side of the gate of each conventional MOSFET on the same wafer as the photodiode regions. The transistor gate spacer 315 has a width 316. Comparing the photodiode structures in FIG. 2 and FIG. 3, the photodiode structure in FIG. 3 is obtained using a gate island spacing 105 that is greater than twice the width 316, for the same insulating layer 107 and associated etching process as used in FIG. 1. The excess separation between the gate islands 102 in FIG. 3 causes the insulating layer 107 (see condition 112 in FIG. 1) to be etched all the way down to the surface of the second region 113 (see FIG. 3). This leads to the formation of excess silicide 320 between the gate islands 102, as seen in FIG. 3. This may affect the amount of incident light that enters the photosensitive regions below the surface of the wafer. With the width 316 of a transistor gate spacer 315 being fixed by the fabrication process, the gate island spacing 105 in the photodiode regions of the wafer should be experimented with to yield the best level of quantum efficiency. Normally, the gate island spacing 105 between two gate islands in the photodiode regions will be substantially less than that which would be needed to form adjacent MOSFETs using the same gate islands.

In a particular embodiment of the photodiode which has yielded acceptable levels of quantum efficiency and leakage current, the p-type region 109 includes an epitaxial layer in which the N-tip implant, and therefore the p-n junction, is formed. In one embodiment, the p-type epitaxial layer has a thickness of 2.75 microns and a doping level of $10^{16}$ cm$^{-3}$ formed on a p substrate with a doping of $10^{19}$ cm$^{-3}$. To make good electrical contact with metal interconnects, the doping in the tip region may be increased to a high level, such as that obtained during the drain/source "diffusion" formation step, normally obtained by ion implantation rather than actual diffusion, of the LDD-based MOS process (see source 418 and drain 416 in FIG. 5.)

Figure 4:
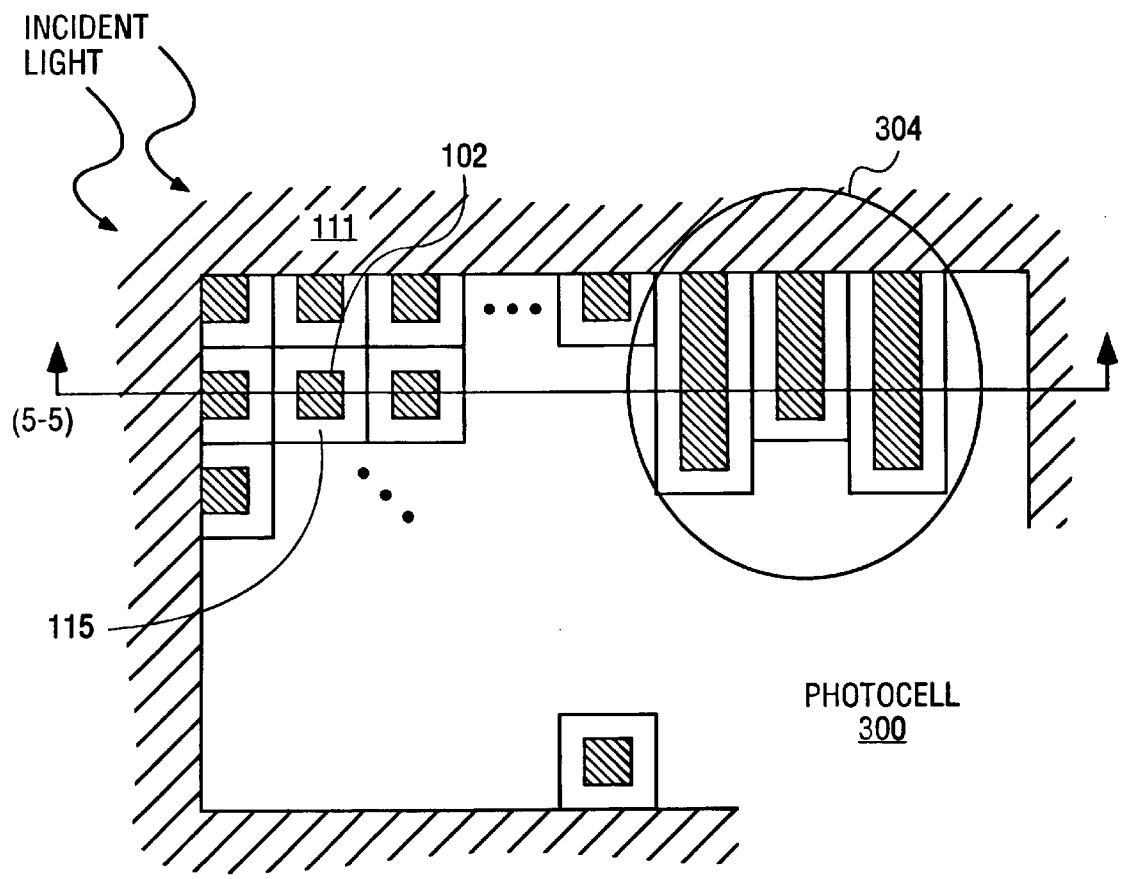
FIG. 4 shows a top view of a photocell according to an embodiment of the invention.
Figure 5:
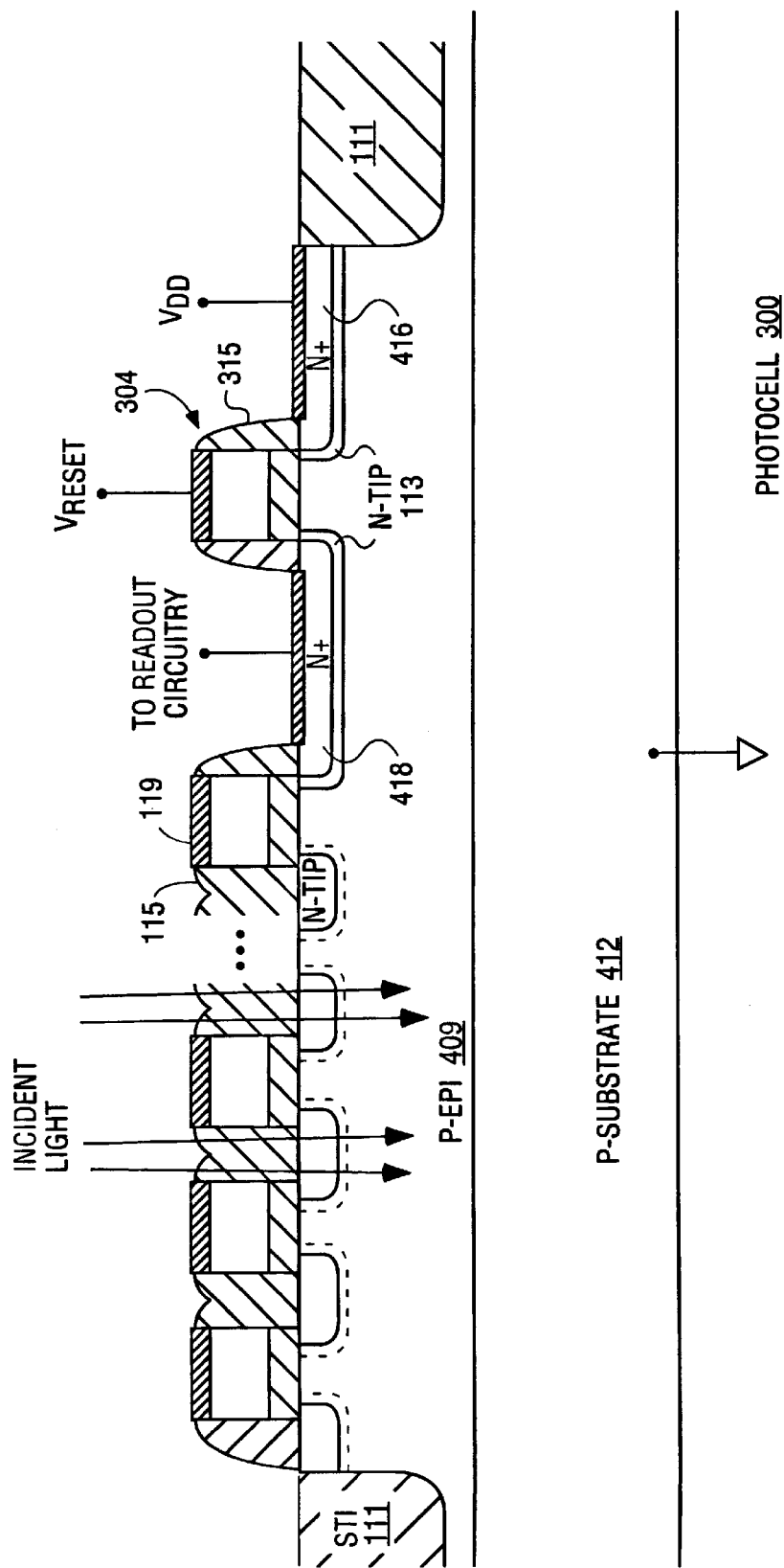
FIG. 5 is a cross-sectional view of the photocell of FIG. 4.

Another embodiment of the invention as part of a photocell 300 is illustrated in FIG. 4 and in FIG. 5. Here, a photodiode structure having a number of gate islands 102 is arranged in a square pattern and is surrounded by isolation regions 111 (e.g. STI below the surface of the wafer.) Of course, the invention is not limited by the square shapes. The isolation regions 111 separate the photocell 300 from similar adjacent cells (not shown.) A cross-sectional view of the photocell 300 along line 5—5 is shown in FIG. 5. A FET 304 has a source "diffusion" 418 formed in the second region 113, a drain diffusion 416 connected to a supply line Vdd, and a gate that receives a reset signal Vreset. When asserted, Vreset causes the photodiode to be reverse biased. One side of the photodiode, here the "n" side, is connected to readout circuitry (not shown) in either the photocell 300 or elsewhere on or off the die which forms the image sensor. The other side, i.e. the "p" side, including the epitaxial layer 409 is connected to common ground through the p-substrate 412.

Figure 6:
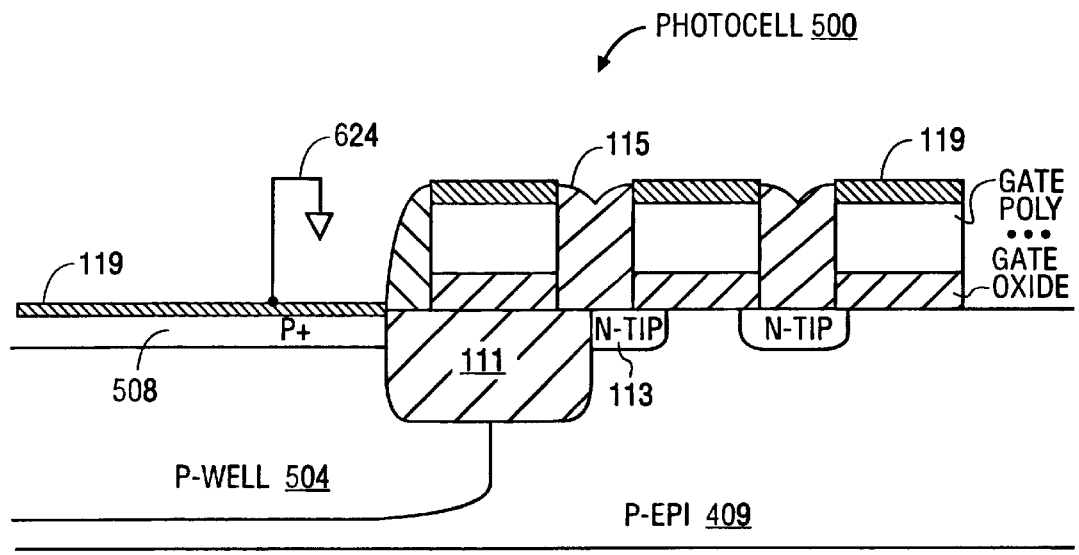
FIG. 6 illustrates a photocell structure according to another embodiment of the invention.

Another embodiment of the invention as a photocell 500 is shown in FIG. 6. Here, a p-well 504 is formed in the p-type epitaxial layer 409 adjacent the gate islands of the photodiode. Normally, the p-well 504 is sufficiently large to allow the formation of at least one n-channel MOSFET therein. A p+ diffusion, such as those used to form the sources/drains of p-channel FETs on the wafer, is formed at the surface of the p-well 504 to make good electrical contact, via the silicide 119 formed thereon, with a metal interconnect 624. In this embodiment, the p-side of the photodiode is connected to common ground through the p-well 504 and the metal interconnect 624. Techniques other than those in FIG. 5 and FIG. 6 may alternatively be used to supply power to the photodiode and extract a signal therefrom.

Figure 7:
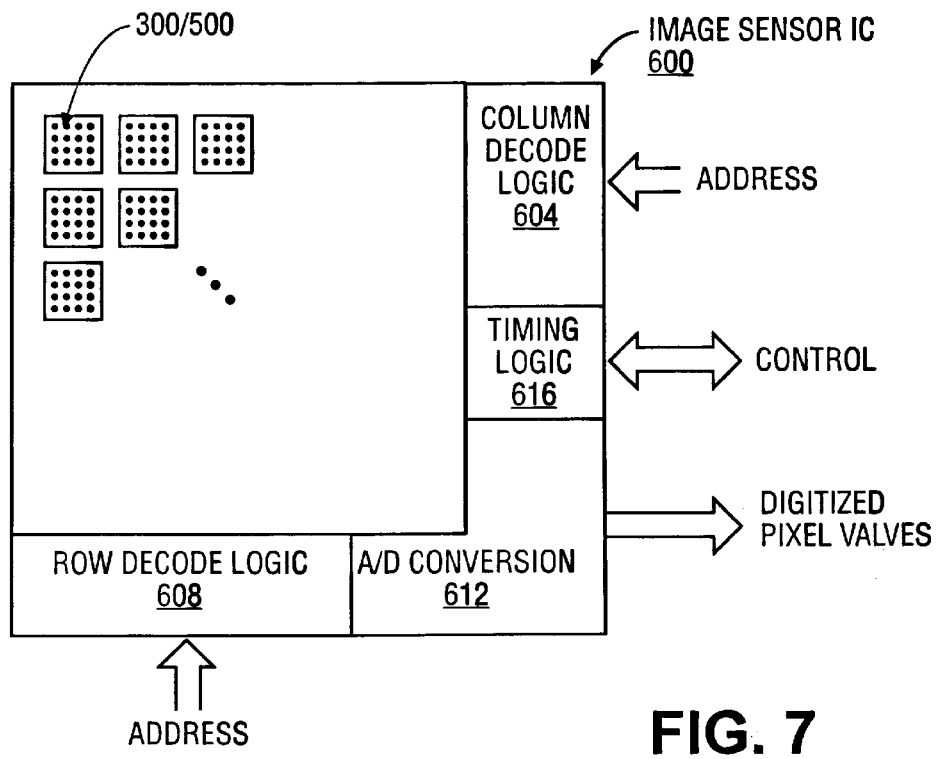
FIG. 7 shows a block diagram of an image sensor chip according to an embodiment of the invention.

The embodiments of the photocells 300 and 500 above may be arranged as an array which is part of an image sensor IC die 600, built using the same MOS process as used to build the photocells, as illustrated in FIG. 7. The IC die 600 includes column decode logic 604 and row decode logic 608 that allow each of the photocells 300/500 to be accessed individually based on a unique address. The photocells may be accessed one row at a time and one column at a time, in response to timing signals generated by timing logic 616 that enable the respective readout circuitry associated with each photocell to provide an analog pixel value representing the detected incident light. These analog pixel values are then digitized by A/D conversion circuitry 612, and provided to a digital processing system (not shown) as a digital image.

To summarize, various embodiments of the invention directed to a novel semiconductor photodiode structure have been described. The photodiode can be built using conventional MOS processes of the polysilicon-silicided gate or self-aligned types, and in particular those which feature LDD FET structures, without requiring an additional mask step that is conventionally used to prevent the formation of the opaque silicide above the photosensitive semiconductor regions.

To summarize, various embodiments of the invention have been described that are directed to a photodiode and associated method of construction, using a conventional MOS process optimized for manufacturing logic circuitry. In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An integrated circuit (IC) die comprising:

a plurality of photodiodes each having a plurality of gate islands being spaced from each other by spacers, each spacer being formed above a p-n junction of the photodiode and permitting light to pass there through and into a photosensitive region of the photodiode, each gate island having a metal layer formed on a surface of a semiconductor layer.

2. The IC die of claim 1 wherein the p-n junction is between an upper semiconductor region and a lower semiconductor region, the upper region having been formed as part of a step in an IC fabrication process used to form a lightly doped drain of a MOSFET in said IC die.

3. The IC die of claim 2 wherein the upper region is a tip region that in part extends horizontally under one of the gate islands.

4. The IC die of claim 1 wherein the p-n junction is between an upper semiconductor region and a lower semiconductor region, a doping level of the upper region being higher than that of the lower region.

5. The IC die of claim 1 wherein the semiconductor layer is of polysilicon, the metal layer is a silicide, and no silicide is formed on the surface of the spacers.

6. The IC die of claim 1 wherein the p-n junction is between an upper semiconductor region and a lower semiconductor region, the upper region having been formed as part of a step in an IC fabrication process used to form a self-aligned source/drain structure of a MOSFET in said IC die.

7. The IC die of claim 1 further comprising an oxide isolation layer that isolates the plurality of photodiodes from one another.

8. The IC die of claim 7 wherein the oxide isolation layer is a shallow trench isolation (STI) structure.

9. The IC die of claim 1 further comprising a color filter layer formed above the photodiodes, a filter of a single color being formed above the plurality of gate islands of each photodiode.

10. The IC die of claim 2 further comprising a plurality of reset MOSFETS each having a source/drain formed in the upper region of a respective one of the plurality of photodiodes, a drain/source coupled to a supply line, and a gate to receive a reset signal which, when asserted, causes the reset MOSFET to conduct and thereby fully reverse bias the respective photodiode.

* * * * *

UNITED STATES PATENT AND TRADEMARK OFFICE
CERTIFICATE OF CORRECTION

PATENT NO.   : 6,091,093
DATED        : July 18, 2000
INVENTOR(S)  : Kang et al.

It is certified that error appears in the above-identified patent and that said Letters Patent is hereby corrected as shown below:

Column 2,
Line 50, delete "formation of suicide" and insert -- formation of silicide --.

Signed and Sealed this

Eighteenth Day of February, 2003

JAMES E. ROGAN
*Director of the United States Patent and Trademark Office*